(12) United States Patent
Ware et al.

(10) Patent No.: US 12,340,123 B2
(45) Date of Patent: Jun. 24, 2025

(54) MEMORY SYSTEMS, MODULES, AND METHODS FOR IMPROVED CAPACITY

(71) Applicant: Rambus Inc., San Jose, CA (US)

(72) Inventors: Frederick A. Ware, Los Altos Hills, CA (US); Scott C. Best, Palo Alto, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 18/496,887

(22) Filed: Oct. 29, 2023

(65) Prior Publication Data

US 2024/0111457 A1  Apr. 4, 2024

Related U.S. Application Data

(63) Continuation of application No. 17/235,629, filed on Apr. 20, 2021, now Pat. No. 11,853,600, which is a continuation of application No. 16/599,891, filed on Oct. 11, 2019, now Pat. No. 11,010,098, which is a continuation of application No. 15/522,164, filed as
(Continued)

(51) Int. Cl.
    *G06F 3/06*  (2006.01)
    *G06F 13/16*  (2006.01)
    *G11C 5/04*  (2006.01)

(52) U.S. Cl.
    CPC .......... *G06F 3/0659* (2013.01); *G06F 3/0604* (2013.01); *G06F 3/0629* (2013.01); *G06F 3/0673* (2013.01); *G06F 13/1673* (2013.01); *G11C 5/04* (2013.01); *Y02D 10/00* (2018.01)

(58) Field of Classification Search
    CPC .... G06F 3/0659; G06F 3/0604; G06F 3/0629; G06F 3/0673; G06F 13/1673; G11C 5/04; Y02D 10/00
    See application file for complete search history.

(56) References Cited

U.S. PATENT DOCUMENTS

| | | |
|---|---|---|
| 6,742,098 B1 | 5/2004 | Halbert et al. |
| 7,020,757 B2 | 3/2006 | Ruhovets et al. |
| 7,778,042 B2 | 8/2010 | Lee et al. |

(Continued)

OTHER PUBLICATIONS

Notification Concerning Transmittal of International Preliminary Report on Patentability with Mail Date Jun. 1, 2017 re: Int'l Appln. No. PCT/US2015/058946. 8 Pages.
(Continued)

*Primary Examiner* — Uyen Smet
(74) *Attorney, Agent, or Firm* — Silicon Edge Law Group LLP; Arthur J. Behiel

(57) ABSTRACT

A memory module with multiple memory devices includes a buffer system that manages communication between a memory controller and the memory devices. The memory module additionally includes a command input port to receive command and address signals from a controller and, also in support of capacity extensions, a command relay circuit coupled to the command port to convey the commands and addresses from the memory module to another module or modules. Relaying commands and addresses introduces a delay, and the buffer system that manages communication between the memory controller and the memory devices can be configured to time data communication to account for that delay.

10 Claims, 12 Drawing Sheets

Related U.S. Application Data application No. PCT/US2015/058946 on Nov. 4, 2015, now Pat. No. 10,459,660.

(60) Provisional application No. 62/082,286, filed on Nov. 20, 2014.

(56) References Cited

U.S. PATENT DOCUMENTS

| | | |
|---|---|---|
| 8,015,386 B1 | 9/2011 | Kulkarni et al. |
| 8,375,240 B2 | 2/2013 | Matsui |
| 8,489,944 B2 | 7/2013 | Morrow et al. |
| 2002/0038405 A1* | 3/2002 | Leddige .............. G06F 13/4256 |
| | | 711/115 |
| 2005/0108469 A1 | 5/2005 | Freeman et al. |
| 2005/0193183 A1 | 9/2005 | Barth et al. |
| 2006/0041730 A1 | 2/2006 | Larson |
| 2006/0095592 A1 | 5/2006 | Borkenhagen |
| 2007/0083701 A1 | 4/2007 | Kapil |
| 2007/0182468 A1 | 8/2007 | Brox et al. |
| 2007/0276976 A1 | 11/2007 | Gower et al. |
| 2009/0190429 A1* | 7/2009 | Brittain .................... G11C 8/18 |
| | | 365/233.1 |
| 2009/0198924 A1 | 8/2009 | Shaeffer et al. |
| 2009/0204831 A1 | 8/2009 | Cousson et al. |
| 2010/0005218 A1 | 1/2010 | Gower et al. |
| 2011/0289269 A1 | 11/2011 | Choi |
| 2012/0159016 A1 | 6/2012 | Morita |
| 2012/0194989 A1 | 8/2012 | Osborne |
| 2013/0036273 A1* | 2/2013 | Shaeffer .............. G06F 12/1009 |
| | | 711/E12.001 |
| 2013/0254495 A1 | 9/2013 | Kim et al. |
| 2014/0108714 A1 | 4/2014 | Lee et al. |
| 2014/0223068 A1 | 8/2014 | Shaeffer et al. |
| 2015/0169254 A1* | 6/2015 | Authement .......... G06F 3/0635 |
| | | 711/103 |

OTHER PUBLICATIONS

Notification of Transmittal of the International Search Report and the Written Opinion of the International Searching Authority or the Declaration with mail date of Feb. 2, 2016 re Int'l. Appln. No. PCT/US15/058946. 14 Pages.

* cited by examiner

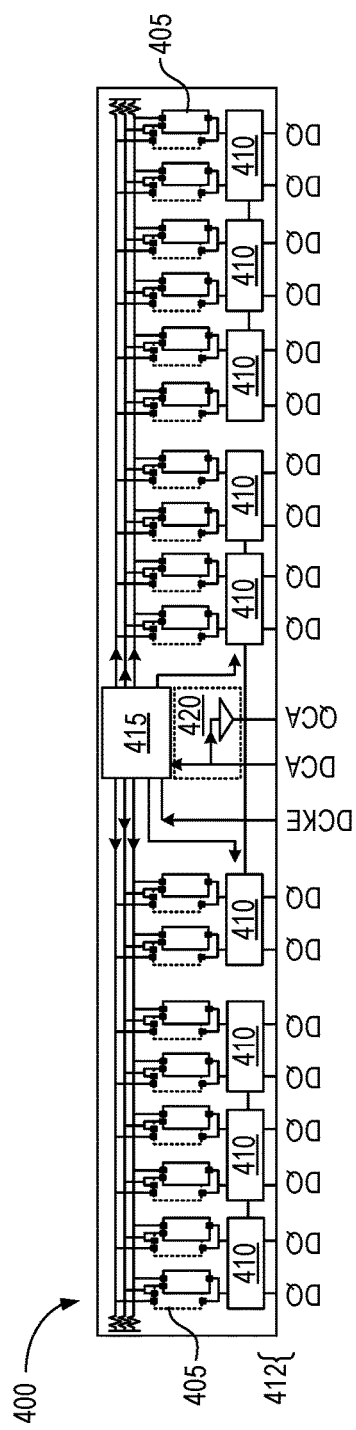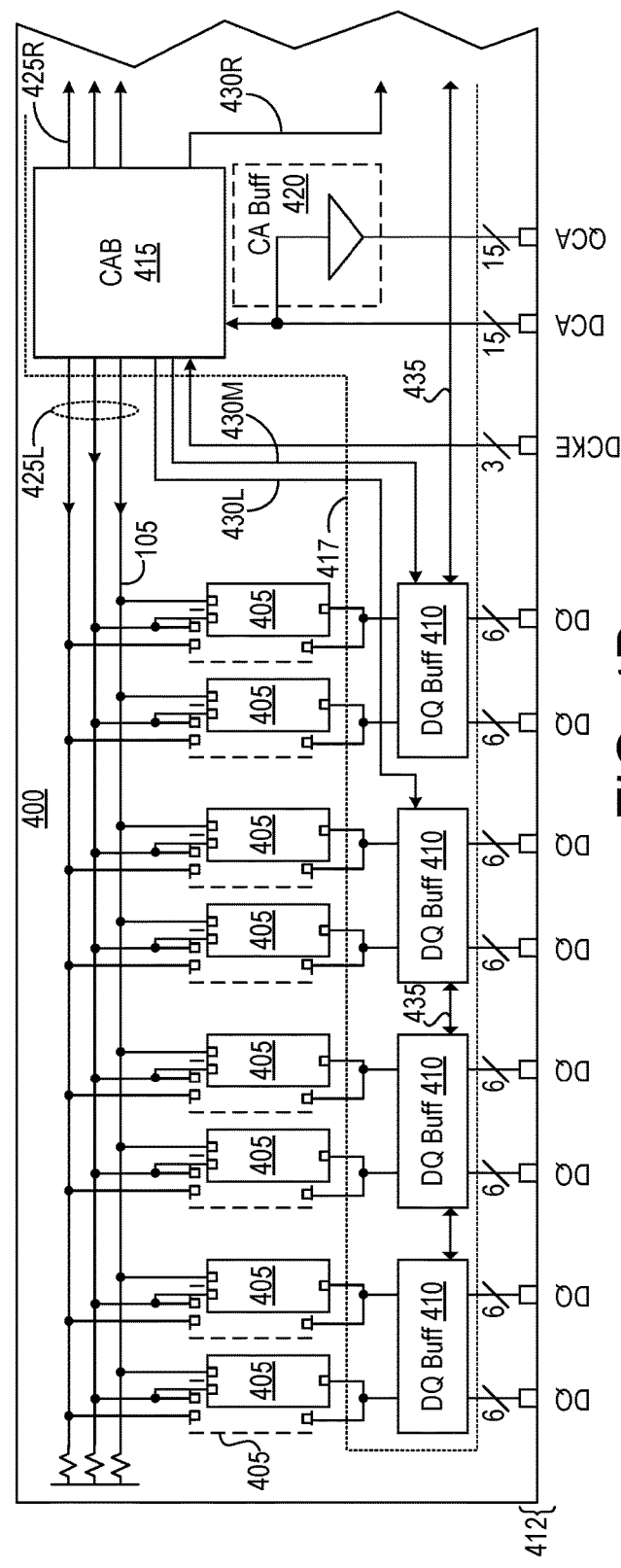
FIG. 4A
FIG. 4B

MEMORY SYSTEMS, MODULES, AND METHODS FOR IMPROVED CAPACITY

FIELD OF THE INVENTION

This invention relates to computer memory systems, and more particularly to modular memory systems.

BACKGROUND

Computer memory systems commonly include a memory controller connected to one or more memory modules via a memory channel or channels. In this context, a "memory module" is a printed-circuit board that supports and interconnects dynamic, random-access memory (DRAM) devices. Computer vendors can offer different amounts of memory by installing more or fewer memory modules, and computer users can upgrade their computers by installing different or additional modules for improved capacity or performance.

Lithographic feature size has shrunk for each generation of DRAM devices. As a result, memory systems have steadily improved in both storage capacity and signaling rates. Unfortunately, one metric of memory-system design that has not shown comparable improvement is the module capacity of a standard memory channel. That is, the number of memory modules that may be connected to a given memory channel has not grown with module capacity and speed performance.

A key reason why module capacity has not grown with other performance metrics is that each module attached to a given channel tends to degrade signals on the channel, necessitating an undesirable reduction in signal rates and concomitant reduction in speed performance. For this reason, modern memory systems are commonly limited to just one or two modules per channel when operating at the maximum signaling rate.

BRIEF DESCRIPTION OF THE DRAWINGS

The present invention is illustrated by way of example, and not by way of limitation, in the figures of the accompanying drawings and in which like reference numerals refer to similar elements and in which:

FIG. 4A depicts a configurable, variable-data-width memory module 400 in accordance with another embodiment.

FIG. 4B depicts the left side of module 400 of FIG. 4A enlarged for ease of illustration.

DETAILED DESCRIPTION

Figure 1A:
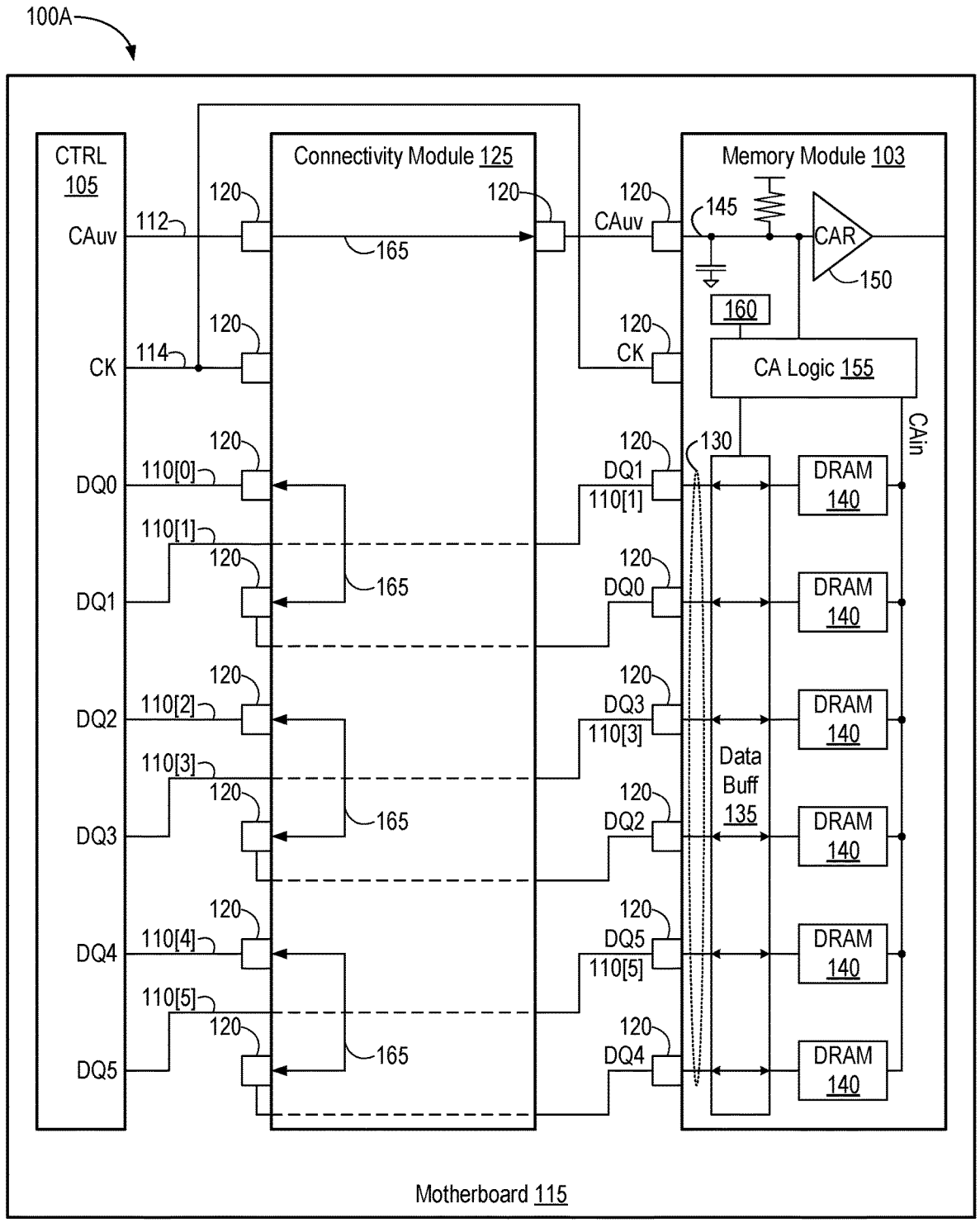
FIG. 1A depicts a memory system 100A in which a memory controller 105 communicates with a memory module 103 via point-to-point data links 110[5:0], a point-to-point command-and-address (CA) link 112, and a clock link 114.

FIG. 1A depicts a memory system 100A in which a memory controller 105 communicates with a memory module 103 via point-to-point data links 110[5:0], a point-to-point command-and-address (CA) link 112, and a clock link 114. Clock link 114 and data links 110[5, 3, 1] traverse a system motherboard 115 to arrive at respective pads 120 that collectively represent a module connector. Memory controller 100 can be part of a central processing unit, or can be a separate integrated circuit.

Memory module 103 is plugged into or otherwise physically connected to pads 120 to establish electrical communication between controller 105 and memory module 103. Data links 110[4, 2, 0] and CA link 112 also traverse motherboard 115, but are connected to memory module 103 via a connectivity module 125 included for this purpose. Connectivity module 125 includes passive electrical connections that communicate command and address signals CAuv and data signals DQ[4,2,0] to memory module 103. One or more of these connections can include active devices in other embodiments. Each of links 110[5:0], 112, and 114 includes one or more signal lines, and examples are detailed in connection with subsequent figures.

Memory module 103 includes a module data interface 130 to communicate data signals DQ[5:0] with controller 105 via signal lines external to the module. A data buffer 135 coupled between module data interface 130 and memory devices 140 manages and steers the flow of data signals between devices 140 and controller 105. Devices 140 are dynamic random-access memory (DRAM) die in this example. Among other functions, buffer 135 can be programed to introduce propagation delays in read and write data signals. As discussed below, the programmable delay supports capacity extensions that reduce or minimize loading effects that would otherwise hinder performance. Buffer 135 also functions as a signal buffer, which in this context means that it intermediates between DRAM devices 140 and the module interface to reduce loading on links DQ[5:0]. Data buffer 135 is shown as a single component in this example, but its functionality can be divided among multiple components.

Memory module 103 additionally includes a command input port 145 to receive command and address signals CAuv from controller 105 and, also in support of capacity extensions, a command relay circuit 150 coupled to command port 145 to convey the commands and addresses from memory module 103. Relay circuit 150 is not used in this one-module example, but can be used to relay command and address signals to another memory module in systems that include one. Command logic 155 coupled to command input port 145 receives memory commands and addresses CAuv from controller 105 and responsively issues command and address signals CAin to buffer 135 and devices 140.

A register 160 stores a configuration value that directs logic 155 whether to power relay circuit 150 and how to configure the delay and steering provided by buffer 135. In this single-module example, traces 165 on connectivity module 125 passively direct command and data signals as shown so that each of links 110[3, 1, 0] extends via a point-to-point connection to a corresponding data port of interface 130. Data buffer 135 is configured to steer each data port to a corresponding one of DRAM devices 140 and relay circuit 150 is disabled to save power.

Memory controller 105 communicates command and address signals CAuv to initiate memory transactions (e.g., read and write transactions) to a rank of six memory devices 140. As used herein, a "rank" is a set of memory devices accessed simultaneously to read and write data. Point-to-point command and data connections facilitate fast and efficient signaling between controller 105 and memory module 103. Memory transactions and point-to-point signaling are familiar to those of skill in the art; a detailed discussion is therefore omitted for brevity.

Figure 1B:
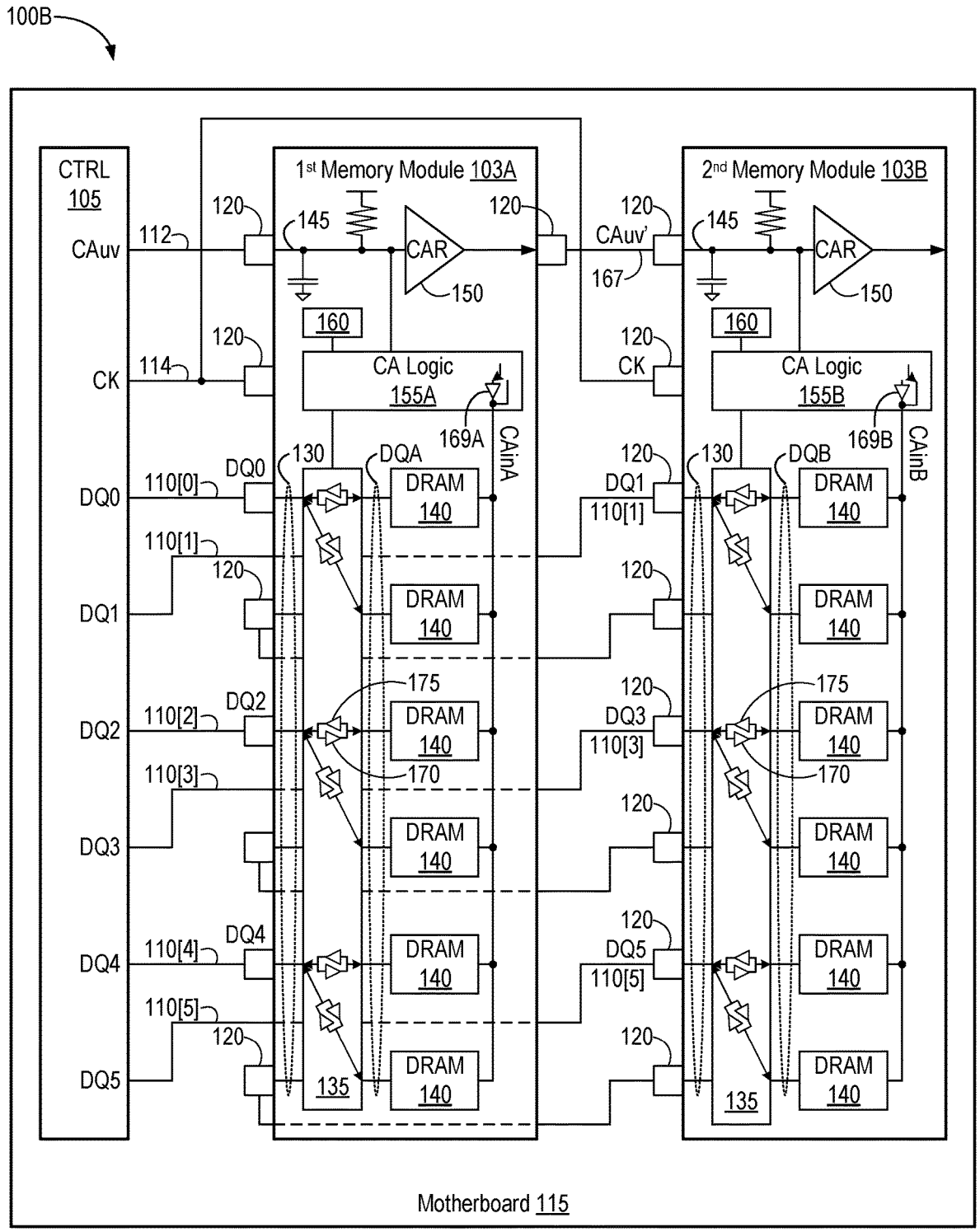
FIG. 1B depicts a memory system 100B in which a memory controller 105 communicates with a pair of memory modules 103A and 103B via respective subsets of point-to-point data links 110[5:0], point-to-point command-and-address (CA) link 112, and clock link 114.

FIG. 1B depicts a memory system 100B in which a memory controller 105 communicates with a pair of memory modules 103A and 103B via respective subsets of point-to-point data links 110[5:0], point-to-point command-and-address (CA) link 112, and clock link 114. Memory system 100B is similar to memory system 100A of FIG. 1A, with like-identified elements being the same or similar, but accesses to a rank of six memory device 140 is divided into two three-device sub-ranks, one on each of memory modules 103A and 103B. Memory modules 103A and 103B can be fungible but programmed to behave differently than one another. In other embodiments memory modules 103A and 103B are purpose-built to perform in the manner detailed below.

Memory modules 103A and 103B are configured differently responsive to different configuration values in their respective registers 160. Considering memory module 103A first, register 160 is programmed to cause command logic 155 to enable relay circuit 150 to convey command and address signals CAuv to memory module 103B as delayed signals CAuv'. Relay circuit 150 is configured to impose a delay of one period of clock signal CK in this embodiment, and to deliver delayed signals CAuv' to memory module 103B via a point-to-point interface 167. A selectable delay element 169A in command logic 155 is configured to impose a delay of one period of clock signal CK to match the delay through relay circuit 150 in delivering signals CAinA. In module 103B, relay circuit 150 is powered down and selectable delay element 169B omits the delay imposed by the same element in module 103A. Command and address signals CAinA and CAinB thus arrive at their respective DRAM devices 140 at the same time.

This two-module configuration provides point-to-point connections for each data link. To accomplish this, data buffer 135 in each of memory modules 103A and 103B is configured to connect its respective DRAM devices 140 to only half the data links, links 110[4, 2, 0] for memory module 103A and links 110[5, 3, 1] for memory module 103B. Buffers 135 in both memory modules 103A and 103B are additionally configured to include delay elements 170 in the write-data signal paths. Delay elements 170 stall write data on interfaces DQA and DQB one clock cycle to match the additional clock cycle of delay imposed on signals CAinA and CAinB. In the read direction, controller 105 adjusts its strobe-enable window to account for the delay Dly1 imposed by CA logic 155A/B and the delay through data buffers 135, but the additional cycle of delay imposed by data buffers 135 for the write case is not required. Buffers 175 in the read represent this retiming delay for data moving between DRAM devices 140 and links 110[5:0].

Figure 1C:
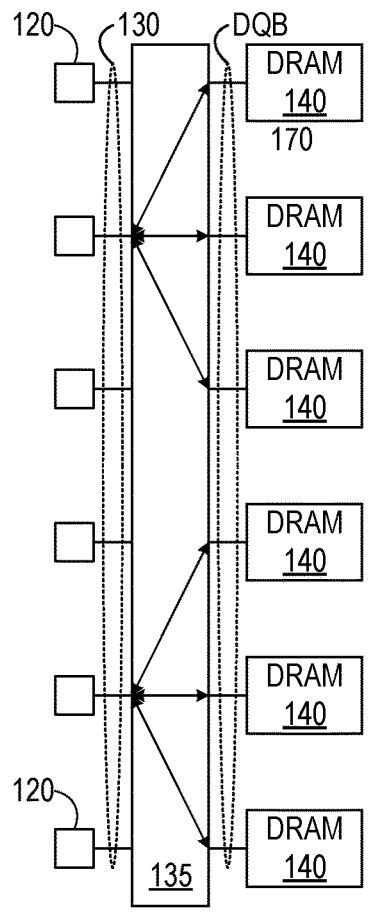
FIGS. 1C and 1D depict additional configurations of data buffer 135.
Figure 1D:
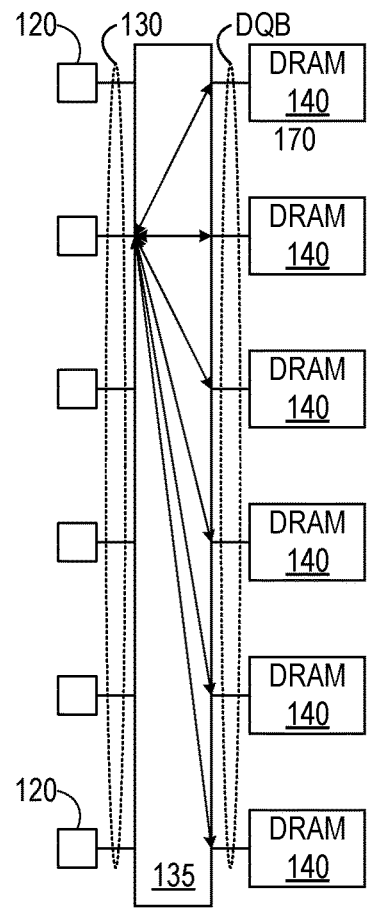

FIGS. 1C and 1D depict additional configurations of data buffer 135. Memory modules 103 can be adapted for use in systems that employ more than two modules for increased memory capacity. Some such systems are detailed below and depicted in FIGS. 3A-3E. In support of such configurations, data buffer 135 on each module 103 can selectively connect each DRAM device 140 to one of two data interfaces (FIG. 1C) or to selectively connect each DRAM device to only one data interface (FIG. 1D). Delays can be imposed in the data paths in the manner noted above.

Figure 2:
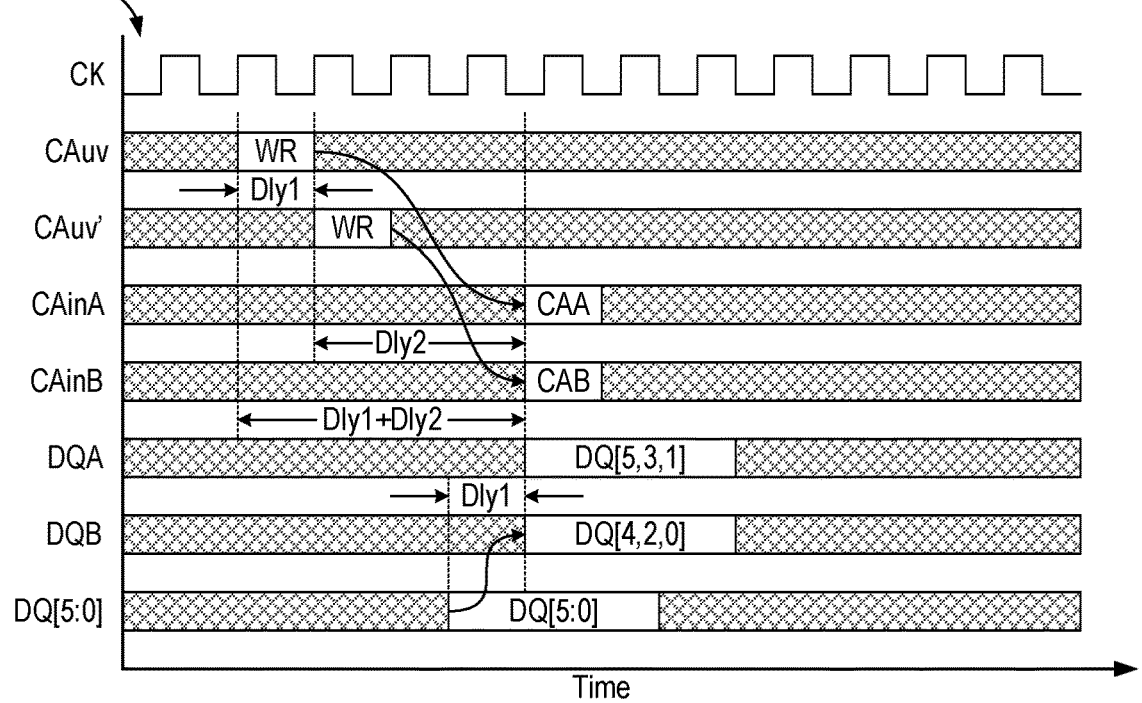
FIG. 2 is a waveform diagram 200 illustrating a write transaction for the two-module memory system 100B of FIG. 1B.

FIG. 2 is a waveform diagram 200 illustrating a write transaction for the two-module memory system 100B of FIG. 1B. Signal names on the vertical axis corresponding to like-identified nodes in FIG. 1B. (In general, signals and their corresponding signal paths are similarly identified. Whether a given reference is to a signal or signal path will be clear in context.) Time, along the horizontal axis, may not be representative of a practical device, but is simplified for ease of illustration. The timing of memory transactions (e.g., read and write transactions) is well understood by those of skill in the art.

The write transaction starts when controller 105 issues a write command WR on CA link 112 as signal CAuv. Relay circuit 150 of memory module 103A imposes a delay Dly1 of one clock cycle and conveys the resultant delayed signal CAuv' to memory module 103B. CA logic 155 in each module interprets write command WR to derive the appropriate command and address signals for their respective DRAM devices 140, a process that imposes a delay Dly2. Delay circuit 169A delays signal CAinA by delay Dly1 to align the timing of signal CAinA on module 103A with signal CAinB on module 103B. The DRAM devices 140 on both memory modules 103A and 103B thus receive their respective write commands and addresses CAinA and CAinB simultaneously. (In this context, "simultaneous" means timed to the same edge of a reference signal.) Data buffers 135 delay write data signals DQ[5:0] by delay Dly1 to account for the similar delay imposed on signals CAinA and CAinB. DRAM devices 140 ultimately store the data responsive to signals CAinA and CAinB. Read transactions are similar, but do not require data buffers 135 to impose the additional clock-cycle of delay.

Memory systems 100A and 100B offer single- and dual-module alternatives in which all data and command links are advantageously point-to-point in support of high data rates. This advantage comes at a cost of one clock cycle of latency. Other embodiments support point-to-point connectivity for greater numbers and more combinations of modules, in which case the relative importance of a small latency penalty diminishes.

Figure 3A:
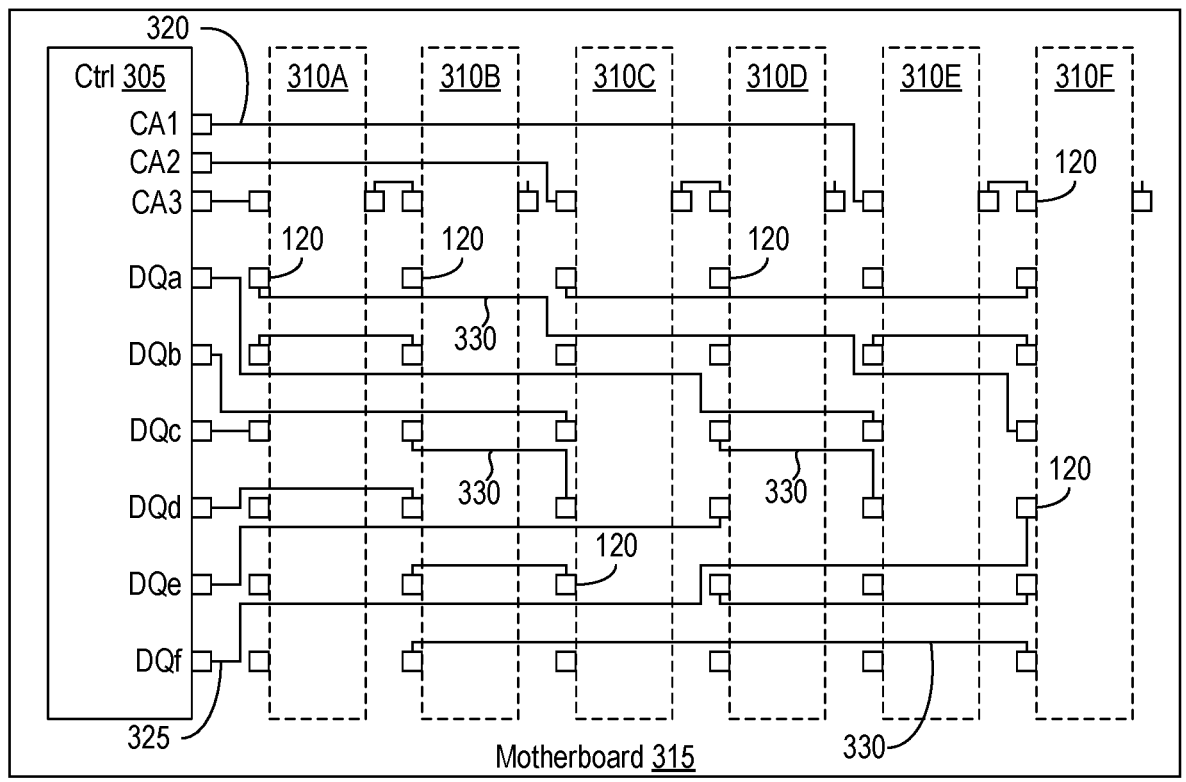
FIG. 3A depicts a memory system in which a memory controller 305 can communicate with up to six memory modules installed in slots 310 via point-to-point connections that extend across a motherboard 315.

FIG. 3A depicts a memory system in which a memory controller 305 can communicate with up to six memory modules installed in slots 310 via point-to-point connections that extend across a motherboard 315. Each slot 310 represents e.g. a module connector or collection of surface-mount electrical contacts.

Memory controller 305 includes three CA ports CA[3:1] and six data ports DQ[a:f]. CA ports CA[3:1] issue similar command and address signals to three of the six slots 310 via point-to-point links 320. Each data port communicates directly with one of slots 310 via a respective data link 325. Additional links 330 extending between slots 310 can be used in conjunction with connectivity modules to establish other point-to-point links, as detailed in the following examples.

Figure 3B:
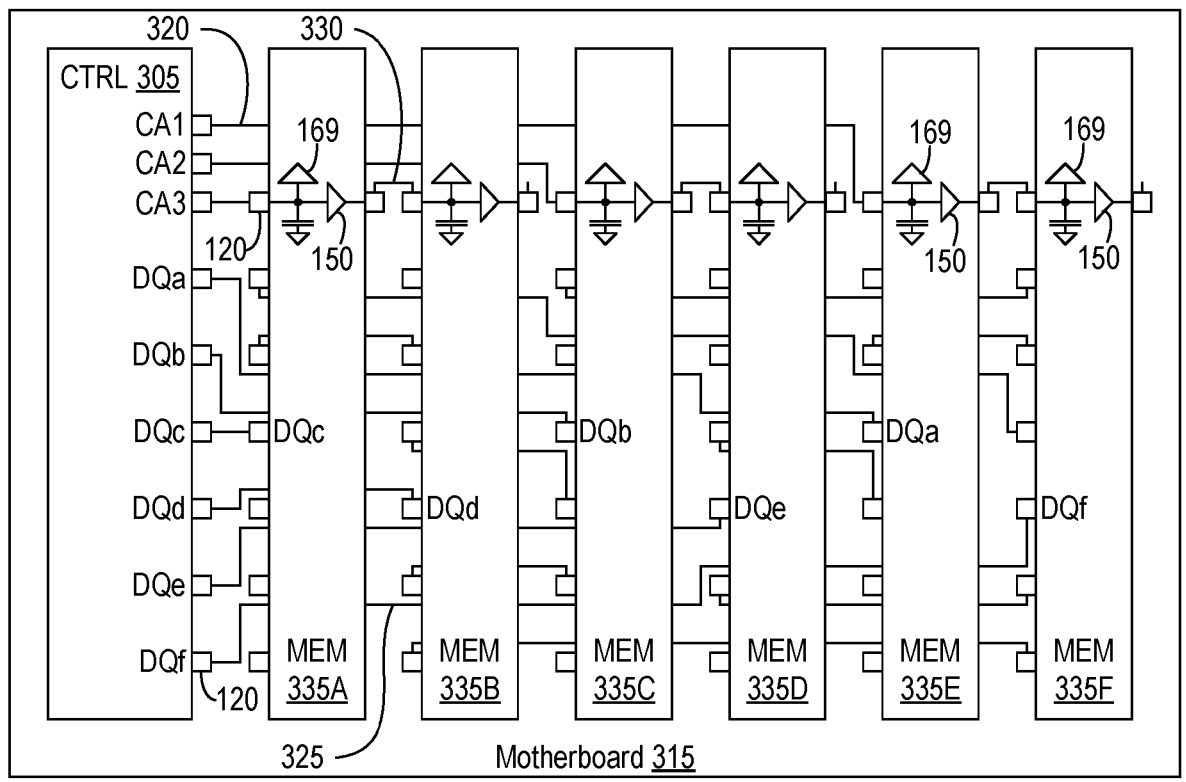
FIG. 3B depicts the memory system of FIG. 3A in which each slot 310 is equipped with one of six fungible, configurable memory modules 335[A:F].

FIG. 3B depicts the memory system of FIG. 3A in which each slot 310 is equipped with one of six fungible, configurable memory modules 335[A:F]. Modules 335[A:F] are similar to memory modules 103A and 103B of FIGS. 1A and 1B, for example including relay circuit 150 and delay element 169 that function as explained previously. Other features of modules 335[A:F] are omitted so as not to obscure the connectivity that supports this six-module configuration.

Each memory module includes a data buffer like buffer 135 of FIGS. 1A and 1B that allows any of multiple DRAM devices to communicate via one, two, three, or all six data ports DQa-f. Each module 335 is configured to read and write via just one of its data ports. Controller 305 has three CA ports CA[3:1]. Pairs of modules are configured as in the example of FIG. 1B such that both share one CA port, with one module relaying command and address signals to the next. For example, module 335E receives signals CA1 via a point-to-point link 320 and relays those signals to module 335F via a relay circuit 150. Delay element 169 and relay circuit 150 are configured as detailed in connection with FIG. 1B. All the data and command links are advantageously point-to-point, albeit at the cost of an additional clock cycle of delay.

Figure 3C:
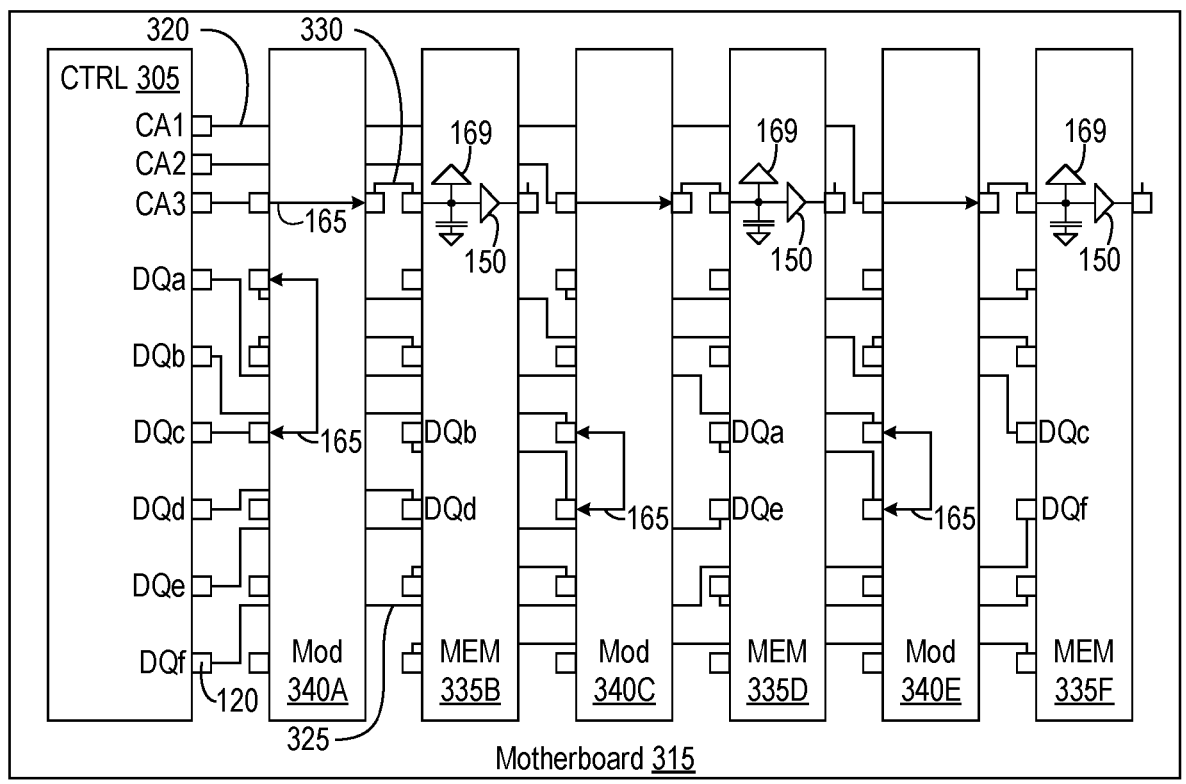
FIG. 3C depicts the memory system of FIG. 3A in which three of slots 310[A:F] are equipped with a memory module (335B, 335D, and 335F) and three are equipped with a conductivity module (340A, 340C, and 340E) that provides connectivity via traces 165.

FIG. 3C depicts the memory system of FIG. 3A in which three of slots 310[A:F] are equipped with a memory module (335B, 335D, and 335F) and three are equipped with a connectivity module (340A, 340C, and 340E) that provides connectivity via traces 165. There are three CA links CA[3:1], one for each module, so none of the command and address signals is buffered. The CA logic and relay circuitry (FIG. 1A) is thus programmed as in the single-module example of FIG. 1A and the additional clock cycle of delay is avoided. The data buffer on each module 335B, 335D, and 335F is configured to read and write via just two of the six data ports. As before, all the data and command links are point-to-point.

Figure 3D:
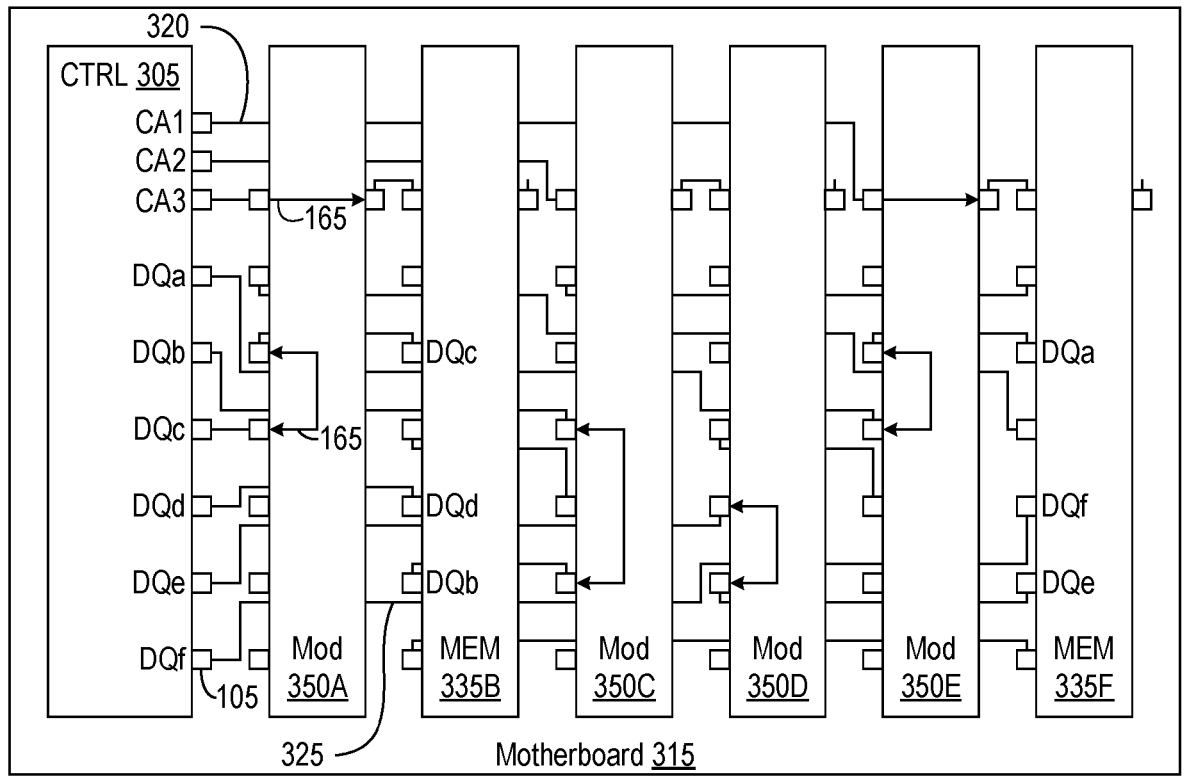
FIG. 3D depicts the memory system of FIG. 3A in which two of slots 310[A:F] are equipped with a memory module (335B and 335F) and four are equipped with conductivity modules (350A, 350C, 350D, and 350E) that provide connectivity via traces 165.

FIG. 3D depicts the memory system of FIG. 3A in which two of slots 310[A:F] are equipped with a memory module (335B and 335F) and four are equipped with connectivity modules (350A, 350C, 350D, and 350E) that provide connectivity via traces 165. The command link for CA2 is not used, and none of the command and address signals is buffered. The CA logic and relay circuitry (FIG. 1A) is thus programmed as in the single-module example of FIG. 1A. The data buffer on each module 335B and 335F (FIG. 1A) is configured to read and write via just three of the six data ports, and all the data and command links are advantageously point-to-point.

Figure 3E:
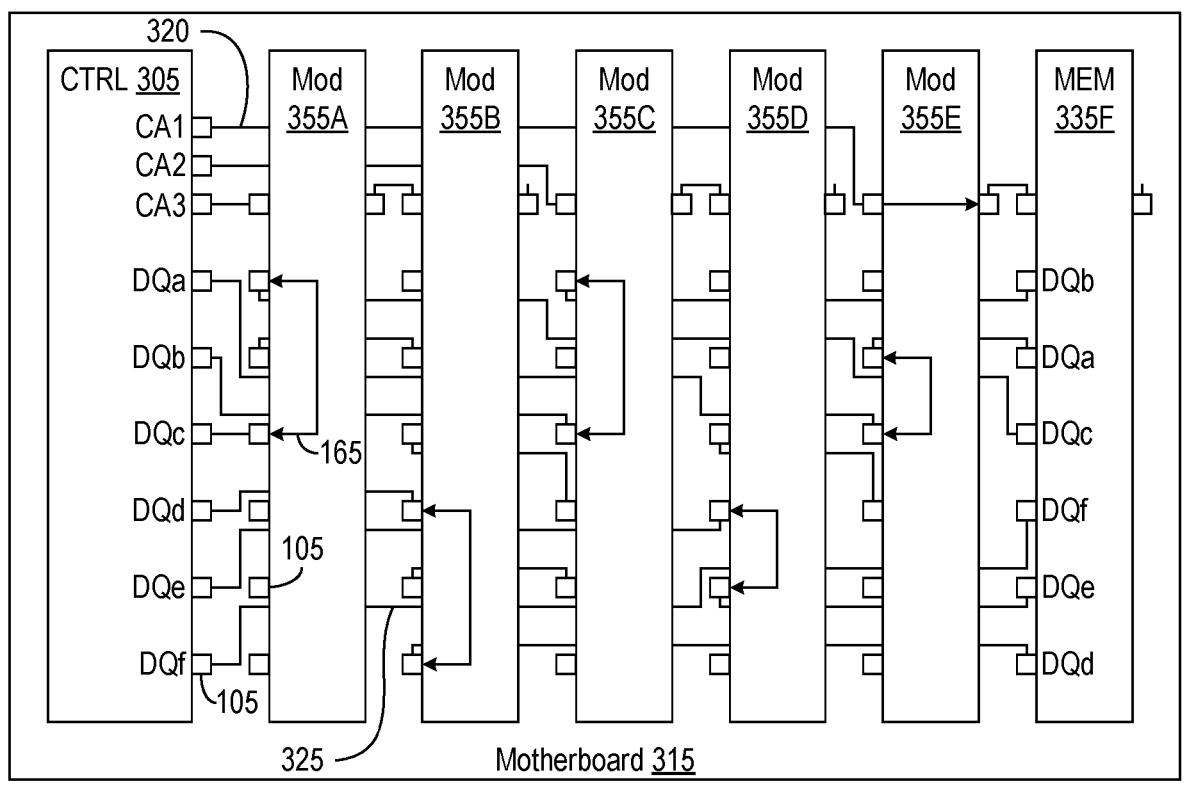
FIG. 3E depicts the memory system of FIG. 3A in which one of slots 310[A:F] is equipped with a memory module (335F) and five are equipped with conductivity modules (350A, 350B, 350C, 350D, and 350E) that provide connectivity via traces 165.

FIG. 3E depicts the memory system of FIG. 3A in which one of slots 310[A:F] is equipped with a memory module (335F) and five are equipped with connectivity modules (350A, 350B, 350C, 350D, and 350E) that provide connectivity via traces 165. The command links for CA2 and CA3 are not used, and none of the command and address signals is buffered. The CA logic and relay circuitry (FIG. 1A) of module 335F is thus programmed as in the single-module example of FIG. 1A, and the data buffer on module 335F (FIG. 1A) is configured to read and write via all six data ports. The data and command links are all point-to-point.

FIG. 4A depicts a configurable, variable-data-width memory module 400 in accordance with another embodiment. Module 400 includes eighteen DRAM components 405 on each side, for a total of 36 components. Each component 405 may include multiple DRAM die, for example two x4 DRAM devices, in which case module 400 would include a total of 72 DRAM devices. Different data widths and different numbers of components and devices can be used in other embodiments.

Module 400 includes three sets of three interconnected data-buffer components 410, or "data buffers." Each set of three components steers data from twelve DRAM components 405 to and from six data ports DQ of a module interface 412. Each DRAM component 405 communicates four-bit-wide (x4, or a "nibble") data DQ and complementary strobe signals DQS and/DQS, for a total of six data bus connections. Data-buffer components 410 in each interconnected group of three can transfer data laterally between themselves.

A command-buffer component (CAB) 415—alternatively called a "Registered Clock Driver" (RCD)—interprets command, address, and chip-select signals on a command port DCA to control memory components 405, data buffers 410, and a relay circuit 420 that can selectively forwards signals on port DCA to another module via port QCA with one clock cycle of delay. A clock-enable port DCKE issues clock-enable signals used to control the power state of e.g. CAB 415 in a manner discussed below. DQ buffers 410, CAB 415, and relay circuit 420 are all part of a buffer system 417 that provides complete buffering of command, address, clock, and data signals. The buffer system can have more or fewer components, and can buffer more or fewer signals or signal types in other embodiments.

Module commands on port DCA direct module 400 to perform memory operations, such as to read from or write to components 405. Addresses associated with the commands identify target collections of memory cells (not shown) in components 405, and chip-select signals associated with the commands allow CAB 415 to select individual integrated-circuit devices, or "chips," for both access and power-state management. A differential clock signal provides reference timing from module 400. Buffer components 410 and CAB 415 each acts as a signal buffer to reduce loading on module interface 412. This reduced loading is in large part due to the fact that each buffer component presents a single load to module interface 412 in lieu of the multiple DRAM devices each buffer component serves.

The leftmost three buffer components 410 can connect one device to one of the six x6 data/strobe ports DQ/DQS, three devices to three of ports DQ/DQS, or six devices to the six ports DQ/DQS. The center and rightmost collections of three buffer components 410 offer similar connectivity. Buffers 410 are "dual-nibble" buffers in this example, and each serves x4 DRAM devices. However, data widths and the ratio of memory components 405 to data buffers 410 can be different, and some or all of the steering and delay functionality attributed to buffers 410 can be incorporated into the memory devices or elsewhere in memory components 405.

The extra buffer 410 and related DRAM components 405 on the right side of module 400 are included in this embodiment to support error checking and correction (ECC). For example, a form of ECC developed by IBM and given the trademark Chipkill™ can be incorporated into module 400 to protect against any single memory device failure, or to correct multi-bit errors from any portion of a single memory device. Buffer components 410 can steer data as necessary to substitute a failed or impaired device.

FIG. 4B depicts the left side of module 400 of FIG. 4A enlarged for ease of illustration. Module 400 is backward compatible with what is conventionally termed a "DDR4 LRDIMM chipset." DDR4 (for "double-data-rate, version 4") is a type of DRAM device, and LRDIMM (for "load-reduced, dual inline memory module") is a type of memory module that employs a separate system of buffers to facilitate communication with the memory devices. Those of skill in the art are familiar with both DDR4 memory and LRDIMM modules, so detailed treatments of these technologies are omitted here. The following discussion highlights aspects of DDR4 LRDIMM circuitry relevant to certain improvements.

DQ buffers 410 are disposed across the bottom of module 400 to minimize stub lengths and concomitant skew between data bits. The operation of module 400 is consistent with that of LRDIMM server components that employ DDR4 memory. Briefly, CAB 415 registers and re-drives signals from the memory controller to access DRAM components 405. CAB 415 interprets command (e.g., in a manner consistent with the DDR4 specification) and conveys corresponding commands to DRAM components 405 via secondary buses 425L and 425R. The signals for secondary busses 425L and 425R are specific to the installed memory devices, and the timing, format, and other parameters of those signals are specified for commercially available devices in a manner well understood by those of skill in the art.

DQ buffers 410 provide load isolation for read, write, and strobe signals to and from components 405, and each receives control signals via one of private busses 430L, 430M, and 430R to e.g. prepare them for the direction of data flow. Private busses 430L, 430M, and 430R can also convey mode-selection information that can alter the way buffers 410 convey data. For example, CAB 415 can configure buffers 410 to induce required delays and to steer data to all or a specified subset of the DQ ports. Connections 435 between buffers 410 convey commands and configuration information from CAB 415, and also communicate data in configurations that steer data.

Figure 5A:
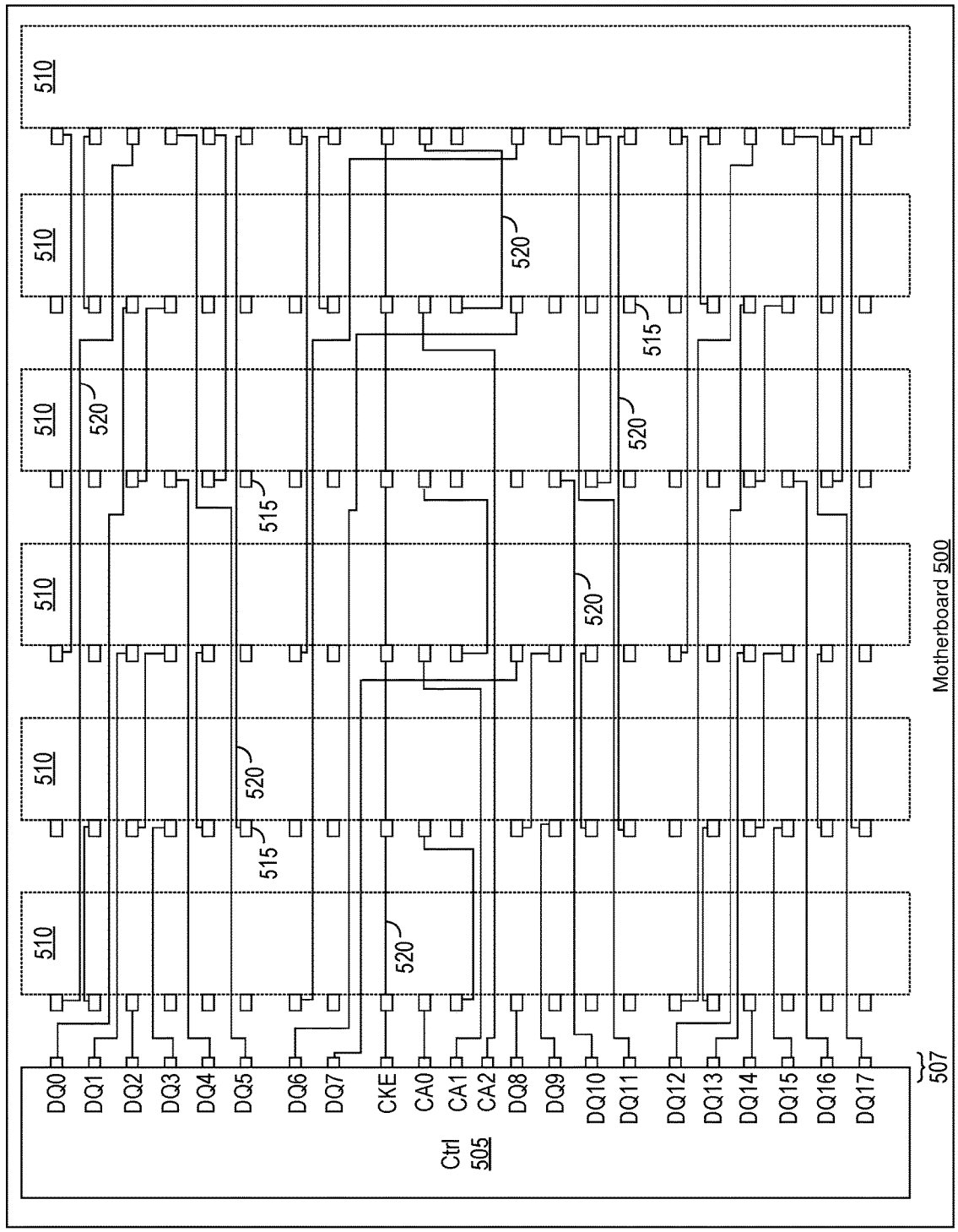
FIG. 5A depicts a motherboard 500 supporting a memory system that includes a controller component 505, six connectors 510 to receive respective memory modules, and contacts 515 and traces 520 to service those connectors.

FIG. 5A depicts a motherboard 500 supporting a memory system that includes a controller component 505, six connectors 510 to receive respective memory modules, and contacts 515 and traces 520 to service those connectors. Using connectivity modules as needed, motherboard 500 can support one, two, three, or six modules in the manner discussed previously in connection with FIGS. 3A-3E.

Figure 5B:
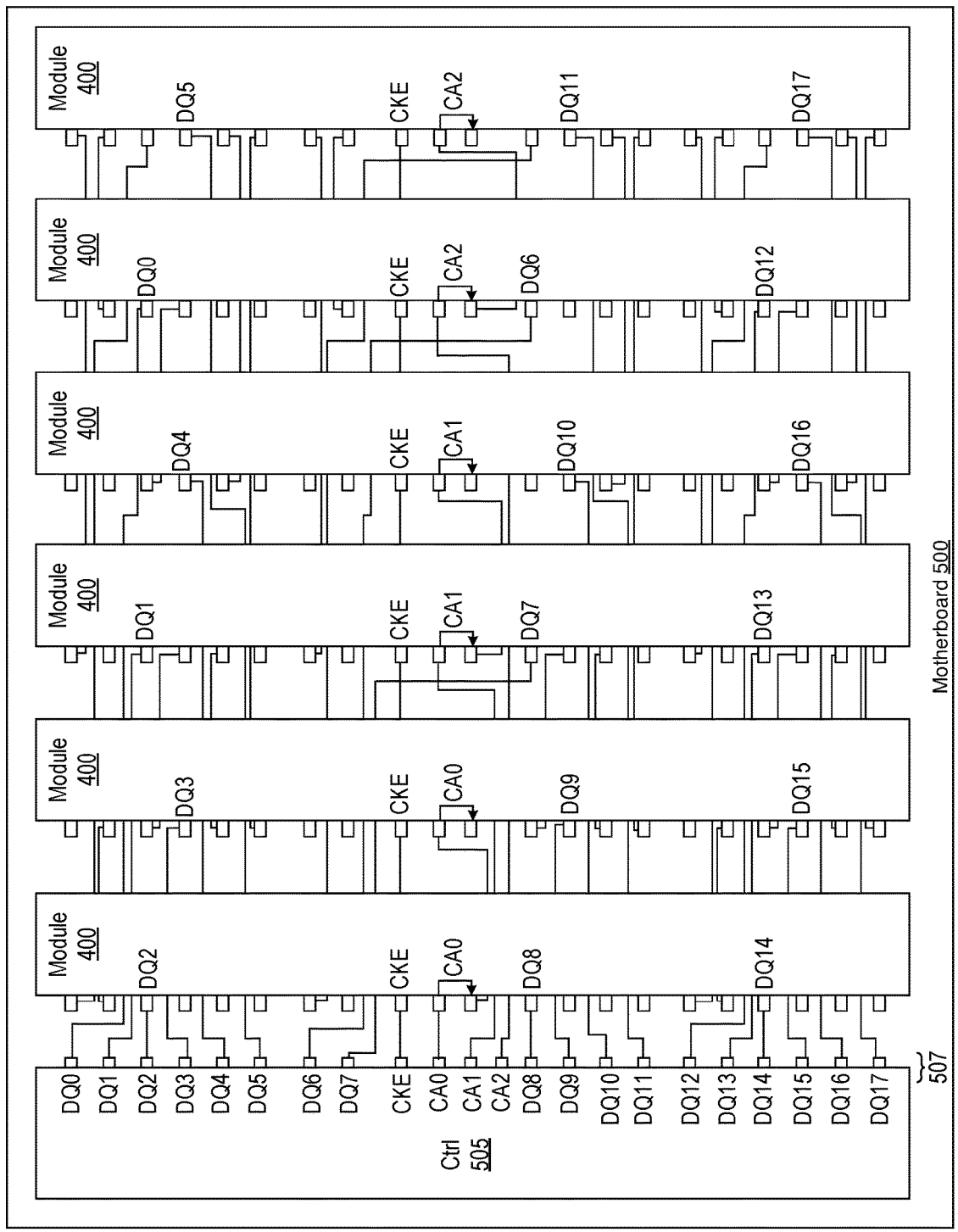
FIG. 5B depicts motherboard 500 of FIG. 5A with six installed modules 400.

FIG. 5B depicts motherboard 500 of FIG. 5A with six installed modules 400. The data buffers 410 (FIGS. 4A and 4B) of each module are configured to communicate via a single data port DQ. Rather than the generic label "DQ" used in FIGS. 4A and 4B, the ports on each module 400 are labeled with a respective identifier from controller component 505 to readily illustrate the point-to-point signal paths between controller component 505 and each module 400. As in the example of FIG. 3B, controller component 505 has three command ports CA[2:0], and pairs of modules are configured as in the example of FIG. 1B such that both share one command port, with one module relaying command and address signals to the next. For example, the leftmost module 400 receives signals CA0 via a point-to-point link and relays those signals to the adjacent module 400 via a relay circuit 420 (FIG. 4B). The relays and buffers are configured as detailed in connection with FIG. 1B.

Figure 5C:
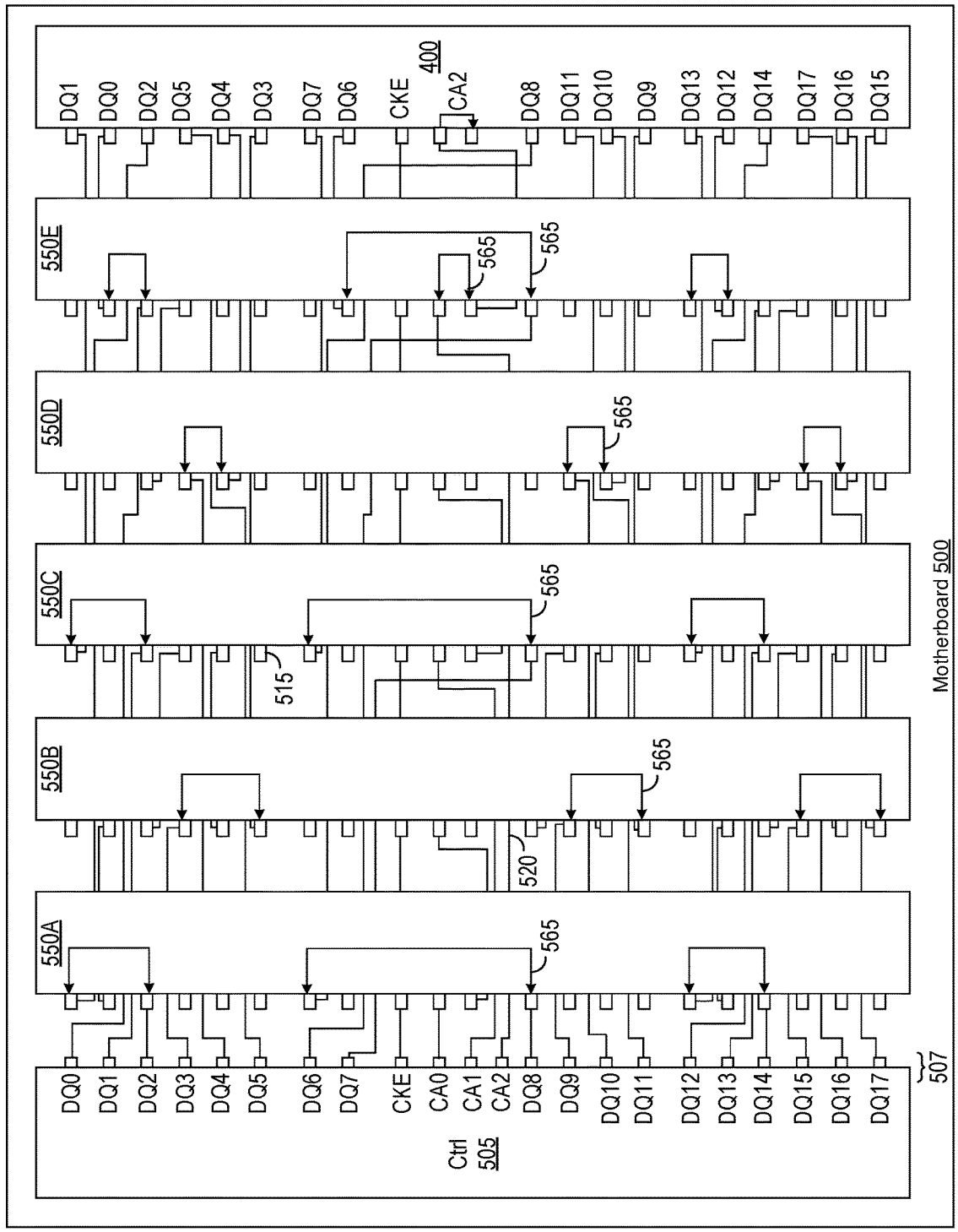
FIG. 5C depicts the memory system of FIG. 5A in which one of the available connectors is equipped with a memory module 400 and the remaining five connectors are equipped with conductivity modules (550[A:E]) that provide connectivity via traces 565.

FIG. 5C depicts the memory system of FIG. 5A in which one of the available connectors is equipped with a memory module 400 and the remaining five connectors are equipped with connectivity modules (550[A:E]) that provide connectivity via traces 565. The command links for CA1 and CA2 are not used, and none of the command and address signals is buffered. The CA logic and relay buffer (FIG. 4A) of module 400 are thus programmed as in the single-module example of FIG. 1A, and module 400 is configured to read and write via all sixteen data ports DQ[15:0].

Figure 5D:
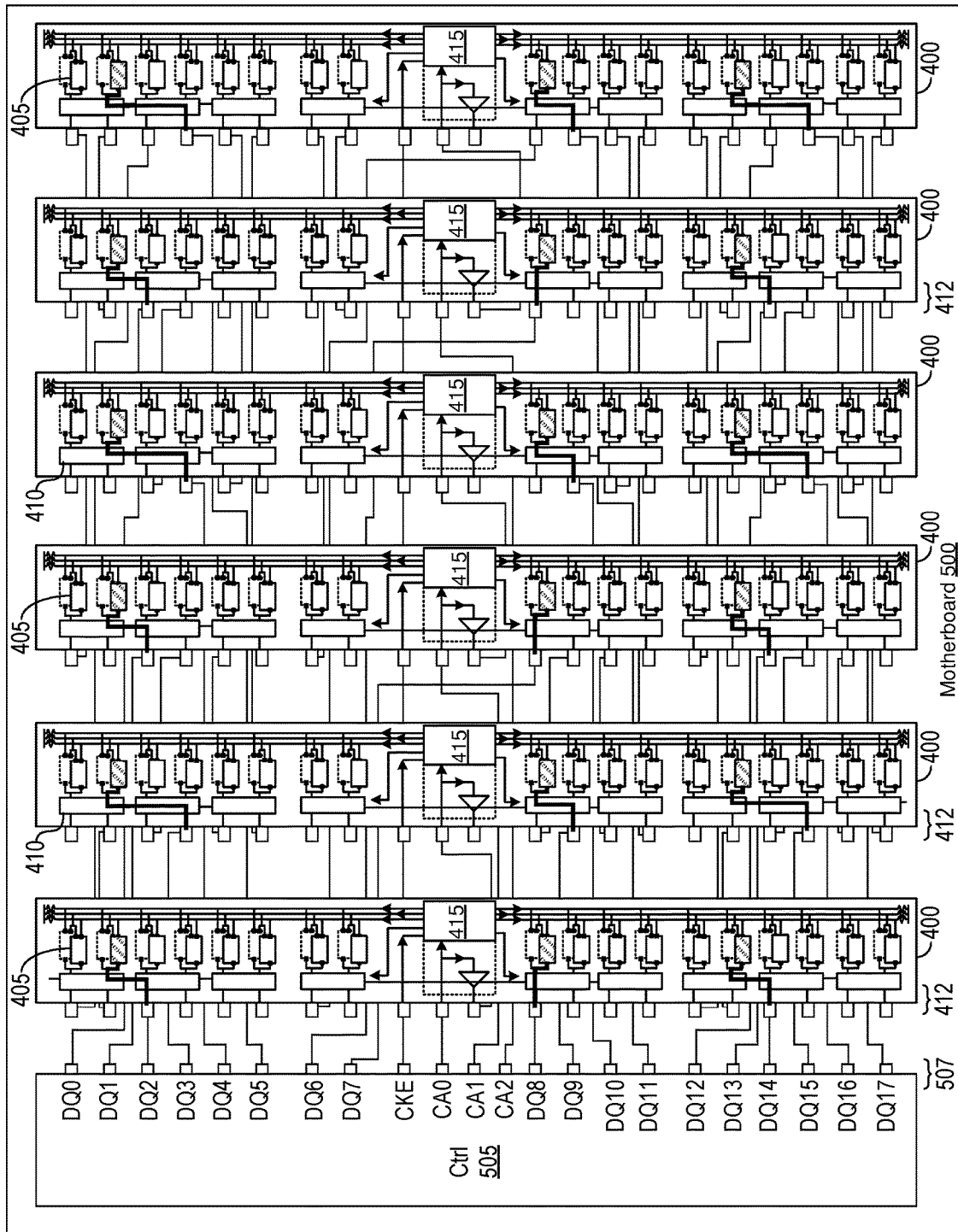
FIG. 5D, like FIG. 5B, depicts motherboard 500 with six installed modules 400.

FIG. 5D, like FIG. 5B, depicts motherboard 500 with six installed modules 400. As detailed in FIGS. 4A and 4B, each module 400 includes nine data buffers 410, each serving four memory components 405, and each component 405 includes two DRAM devices (not shown). Each module therefore includes 9×4×2=72 DRAM devices, and the six-module system of FIG. 5D includes 72×6=432 DRAM devices.

Data connectivity is distributed from controller component 505 to the six modules in the manner detailed in connection with FIGS. 5A and 5B. Controller component 505 includes a controller interface 507 with eighteen x4 data ports DQ[17:0], three of which are served by each of the six modules 400. The leftmost module 400, for example, services ports DQ[2,8,14] in this embodiment. Still referencing the leftmost module 400, CAB 415 and data buffers 410 steer three selected DRAM devices to ports DQ[2,8,14] for every read or write transaction. The remaining modules 400 similarly steer data two and from three data ports to an active set of three DRAM devices.

FIG. 5D illustrates an active rank of eighteen DRAM devices by cross-hatching three DRAM components 405 on each module 400. Bold lines highlight the connectivity provided by data buffers 410 at the direction of CAB 415. Each module 400 supports 24 such combinations of three-device "sub-ranks," giving the six-module system support for 24 eighteen-device ranks. As used herein, a "sub-rank" is a module-specific fraction of a memory rank distributed across multiple memory modules.

Each memory transaction activates an entire rank. In some memory systems, a rank refers to a set of memory devices on one module and connected to the same chip-select for simultaneous access. Memory modules commonly include multiple ranks. Assuming modules of the type and capacity of module 400, such a module would enable one of a number of eighteen-device ranks on each module for each memory transaction. Enabling a memory device consumes power, so enabling eighteen devices on each module when only three are required, or 108 devices in a system when only eighteen are requires, is wasteful. Embodiments of module 400 are thus adapted to afford considerably greater access granularity than is available in this type of memory system. In particular, CAB 415 and DQ buffer 410 support sub-rank access granularities that considerably reduce power consumption when ranks are distributed across memory modules.

Figure 6:
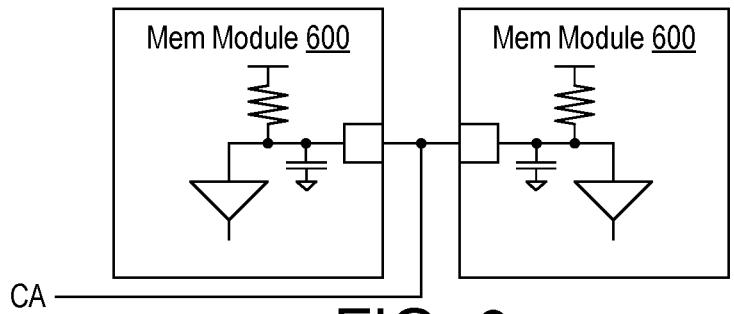
FIG. 6 depicts a memory system in which a single command link CA communicates command and address signals simultaneously to two buffered modules 600.

FIG. 6 depicts a memory system in which a single command link CA communicates command and address signals simultaneously to two buffered modules 600. This type of connection, termed a "point-to-two-point" connection, does not support the highest speed performance available from a point-to-point connection, but can be used without introducing latency in the manner of the embodiments detailed above.

Figure 7:
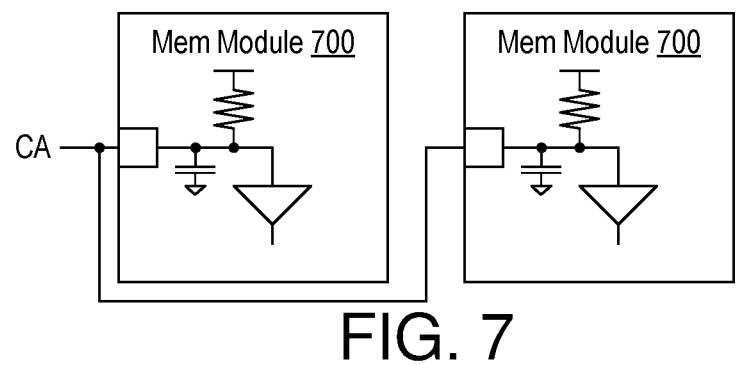
FIG. 7 depicts a memory system in which a single command link CA communicates command and address signals simultaneously to two buffered modules 700.

FIG. 7 depicts a memory system in which a single command link CA communicates command and address signals simultaneously to two buffered modules 700. This type of connection, termed a "fly-by" connection, also tends to be slower than a point-to-point connection, but can be used without introducing additional latency.

Figure 8:
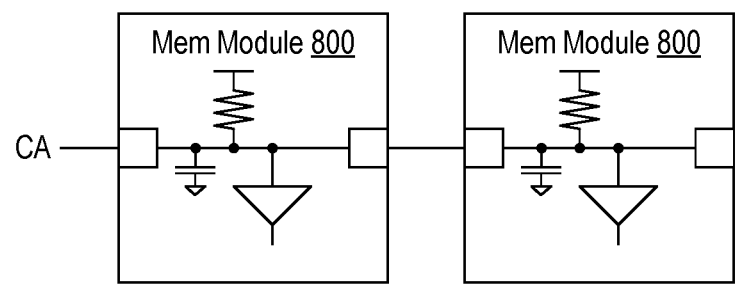
FIG. 8 depicts a memory system in which a single command link CA communicates command and address signals simultaneously to two buffered modules 800.

FIG. 8 depicts a memory system in which a single command link CA communicates command and address signals simultaneously to two buffered modules 800. This connectivity is similar to that of FIG. 7, but the CA connectivity is provided to the second module 800 via the first module 800. Similar to FIG. 7, it can also be used without introducing additional latency.

Figure 9:
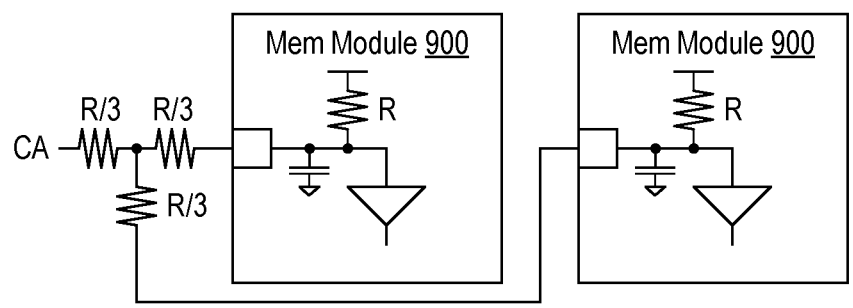
FIG. 9 depicts a memory system in which a single command link CA communicates command and address signals simultaneously to two buffered modules 900.

FIG. 9 depicts a memory system in which a single command link CA communicates command and address signals simultaneously to two buffered modules 900. This connection uses a power splitter with three resistors, each of a value one-third that of a termination resistance R on each module 900. As in the examples of FIGS. 6, 7, and 8, this connectivity tends to be slower than point-to-point but does not require latency be inserted into the command path.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Similarly, signals described or depicted as having active-high or active-low logic levels may have opposite logic levels in alternative embodiments.

With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While memory systems have been described in connection with specific embodiments, variations of these embodiments are also envisioned. These examples are in no way exhaustive, as many alternatives within the scope of the claims will be obvious to those of ordinary skill in the art. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. For U.S. applications, only those claims specifically reciting "means for" or "step for" should be construed in the manner required under the sixth paragraph of 35 U.S.C. § 112.

What is claimed is:

1. A memory module comprising:
   a memory device;
   a command input port to receive module commands;
   command logic coupled between the command input port and the memory device, the command logic to issue memory-device commands to the memory device responsive to the module commands and including a selectable command-delay element to selectively impose or omit a propagation delay on the memory-device commands relative to the module commands; and
   a command-relay circuit coupled to the command input port, the command-relay circuit to relay the module commands away from the memory module;
   wherein the command-relay circuit, when enabled, imposes the same propagation delay imposed by the selectable command-delay element on the memory-device commands relative to the module commands.

2. The memory module of claim 1, wherein the command-relay circuit is disabled.

3. The memory module of claim 1, further comprising a module data port and a delay-configurable data buffer to communicate data to the memory device.

4. The memory module of claim 3, further comprising a register to store a value controlling the delay-configurable data buffer.

5. The memory module of claim 4, the register to control the selectable command-delay element.

6. A buffer system for a memory module, the buffer system comprising:
   a command input port to receive module commands;
   a command buffer coupled to the command input port to buffer the module commands, the command buffer including a selectable command-delay element to selectively impose or omit a propagation delay on the module commands; and
   a command-relay circuit coupled to the command input port, the command-relay circuit to relay the module commands away from the memory module;
   wherein the command-relay circuit, when enabled, imposes the same propagation delay imposed by the selectable command-delay element on memory-device commands relative to the module commands.

7. The buffer system of claim 6, wherein the command-relay circuit is disabled.

8. The buffer system of claim 6, further comprising a data port to receive data signals and a delay-configurable data buffer to selectively delay the data signals.

9. The buffer system of claim 8, further comprising a register to store a value controlling the delay-configurable data buffer.

10. The memory module of claim 9, the register to control the selectable command-delay element.

* * * * *